United States Patent
Muller et al.

(10) Patent No.: US 6,255,189 B1
(45) Date of Patent: Jul. 3, 2001

(54) METHOD OF MANUFACTURING A SEMICONDUCTOR DEVICE IN A SILICON BODY, A SURFACE OF SAID SILICON BODY BEING PROVIDED WITH AN ALIGNMENT GRATING AND AN AT LEAST PARTLY RECESSED OXIDE PATTERN

(75) Inventors: Christiaan J. Muller; Frank A. J. M. Driessen, both of Nijmegen (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/421,347

(22) Filed: Oct. 19, 1999

(30) Foreign Application Priority Data

Oct. 20, 1998 (EP) .................................................. 9820353

(51) Int. Cl.⁷ .................................................. H01L 21/76
(52) U.S. Cl. ........................................... 438/401; 438/462
(58) Field of Search .................................... 438/401, 424, 438/426, 462, 975, 689

(56) References Cited

U.S. PATENT DOCUMENTS

| | | | |
|---|---|---|---|
| 4,251,160 | * 2/1981 | Bouwhuis et al. | 356/40 |
| 5,025,165 | * 6/1991 | Chen et al. | 250/491 |
| 5,503,962 | * 4/1996 | Caldwell | 430/317 |
| 5,700,732 | * 12/1997 | Jost et al. | 438/401 |
| 6,049,137 | * 4/2000 | Jan et al. | 257/797 |

* cited by examiner

Primary Examiner—David Nelms
Assistant Examiner—David Nhu
(74) Attorney, Agent, or Firm—Steven R. Biren

(57) ABSTRACT

In the known process for manufacturing a semiconductor device, in particular an integrated circuit, in a silicon body, a surface of said silicon body is provided with an alignment grating formed in accordance with a pattern of strips of adjacent elevations and valleys, and with a partially recessed oxide pattern at the location of a semiconductor device by subsequently providing the surface of the silicon body with a masking layer of anti-oxidation material having apertures at the location of the semiconductor device and subjecting the silicon body to an oxidation treatment. The process is simplified considerably by applying the alignment pattern (7) simultaneously with the partially recessed oxide pattern (12) of the semiconductor device (5). For this purpose, the masking layer of anti-oxidation material is applied at the location of the alignment pattern which consists of first wide strips, which are totally free of recessed oxide, and second wide strips, which are each formed by a sub-pattern of relatively narrow strips of anti-oxidation material alternating with relatively narrow apertures, which are smaller than the apertures at the location of the semiconductor device. During the subsequent oxidation treatment, each of the second wide strips is provided with a segmented, partially recessed oxide pattern (14) with a profiled surface. The relatively narrow apertures have a width such that the partially recessed oxide pattern (14) at the location of the alignment pattern (7) is thinner than the partially recessed oxide pattern (12) simultaneously formed at the location of the semiconductor device (5).

11 Claims, 6 Drawing Sheets

METHOD OF MANUFACTURING A SEMICONDUCTOR DEVICE IN A SILICON BODY, A SURFACE OF SAID SILICON BODY BEING PROVIDED WITH AN ALIGNMENT GRATING AND AN AT LEAST PARTLY RECESSED OXIDE PATTERN

BACKGROUND OF THE INVENTION

The invention relates to a method of manufacturing a semiconductor device, in particular an integrated circuit, in a silicon body which is provided at a surface with an alignment grating for aligning the silicon body relative to masks which are used in a number of successive process steps to image patterns onto the surface of the silicon body, the alignment grating being provided in the form of a strip pattern of adjacent elevations and valleys, and the surface also being provided with a mask of a material which protects the silicon body against oxidation, which mask is provided with apertures at the location of the semiconductor device, whereafter the silicon body is provided with an oxide pattern by means of oxidation, which pattern is recessed in the silicon body over at least a part of its thickness and defines active regions in the silicon body.

A method of the type mentioned in the opening paragraph is known from U.S. Pat. No. 5,700,732. In said known method, prior to the manufacture of a semiconductor device, which is provided with an oxide pattern which is at least partly recessed in a silicon body, a surface of the silicon body is provided with an alignment grating in the form of a strip pattern of adjacent elevations and valleys, which correspond to a difference in height which is desirable for aligning. In subsequent process steps carried out to manufacture the semiconductor device, the previously provided alignment grating is used to align the silicon body relative to masks which, during these process steps, are used to image patterns onto the surface of the silicon body.

A disadvantage of the known method is that, prior to the process steps, which are relevant for the manufacture of the semiconductor device, extra process steps are necessary to provide the alignment grating. These extra process steps generally include a lithography step in which regions on the surface of the silicon body are defined for the valleys to be ultimately provided, followed by an etch step in which the valleys are formed by performing an etching operation on the silicon body over a specific distance corresponding to the difference in height necessary for aligning. The extra lithography and etch steps contribute significantly to the overall number of necessary process steps and hence to the total process costs.

SUMMARY OF THE INVENTION

It is an object of the invention to provide a method of the type mentioned in the opening paragraph, which enables a semiconductor device with a partly recessed oxide pattern in a silicon body to be manufactured, without the necessity of extra process steps for providing an alignment grating necessary for the manufacture of the semiconductor device.

To achieve this, the inventive method mentioned in the opening paragraph is characterized in that the alignment grating and the partly recessed oxide pattern are provided simultaneously, the material which protects against oxidation being provided at the location of the alignment grating to be produced so as to comprise first wide strips, where the surface remains entirely free of recessed oxide, which alternate with second wide strips, which are each formed by a sub-pattern of relatively narrow strips of the material which protects against oxidation, which narrow strips are separated from each other by relatively narrow apertures, which are smaller than the apertures at the location of the semiconductor device, whereafter, during oxidation, each of the second wide strips is provided with a segmented, also partly recessed, oxide pattern with a profiled surface, the relatively narrow apertures having a width such that the recessed oxide pattern in the alignment grating is thinner than the simultaneously formed recessed oxide pattern in the semiconductor device. It has been established by experiment that if a silicon body, on which a mask of a material providing a shield against oxidation is provided, which mask is patterned at the location of the alignment grating to be formed, as mentioned in the measure of the invention, is subjected to oxidation, oxide is formed in the relatively narrow apertures at the location of the alignment grating, the thickness of the oxide being smaller than that of the oxide simultaneously formed in the apertures at the location of the semiconductor device. The smaller the apertures made at the location of the alignment grating, the thinner the oxide in these apertures ultimately becomes. In the method in accordance with the invention, this is used to create, at the location of the alignment grating, a difference in height necessary for aligning the silicon body, which difference in height is smaller than that which would be created if the oxide could also attain the full thickness at the location of the alignment grating, i.e. the thickness at the location of the semiconductor device. In this manner, it is possible to provide an oxide pattern which is partly recessed in the silicon body and simultaneously provide the surface of the silicon body with an alignment grating necessary for the further manufacture of the semiconductor device, without this leading to extra process steps and hence extra process costs.

An embodiment of the method in accordance with the invention is characterized in that the alignment grating is used, both in process steps preceding the provision of the opaque layer and in subsequent process steps, to align the silicon body relative to the masks used in the relevant process steps. By virtue thereof, the alignment grating can be used for aligning purposes throughout the manufacture of the semiconductor device.

An embodiment of the method in accordance with the invention is characterized in that the recessed oxide pattern in the alignment grating is provided in such a manner that at the location of the alignment grating an average optical difference in height is achieved between the first and the second wide strips, which corresponds approximately to $(2n+1)\lambda/4$, where n is an integer $\geq 0$ and $\lambda$ is the wavelength of the light used for aligning. In order to minimize aligning errors during aligning the silicon body relative to a mask, it is favorable to create an average optical difference in height corresponding to approximately $(2n+1)\lambda/4$ at the location of the alignment grating.

An embodiment of the method in accordance with the invention is characterized in that approximately $\lambda/4$ is used as the average optical difference in height. As mentioned hereinabove, it has been found that the smaller the relatively narrow apertures at the location of the alignment grating are, the thinner the oxide in these apertures eventually becomes. In view of a possible future shift to smaller pitches as a result of, for example, the steadily increasing use of higher diffraction-order signals for aligning the silicon body, an average optical difference in height of approximately $\lambda/4$ has the advantage that relatively small pitches are possible.

An embodiment of the method in accordance with the invention is characterized in that the recessed oxide pattern in the alignment grating is provided so as to have an average thickness in the range from approximately 0.1 to 0.4 µm. For a usable range of wavelengths lying between 500 and 1100 nm, it has been found that, if the thickness of the recessed oxide pattern in the alignment grating lies in the range from approximately 0.1 to 0.4 µm, an average optical difference in height corresponding to approximately λ/4 is achieved between the first and second wide strips of the alignment grating, thereby minimizing alignment errors.

An embodiment of the method in accordance with the invention is characterized in that the recessed oxide pattern in the semiconductor device is provided so as to have a thickness ranging from 0.5 to 1.0 µm. If the thickness of the recessed oxide pattern in the semiconductor device lies in the above-indicated range, it is possible, using the method in accordance with the invention, to create the optical difference in height, necessary for aligning, of approximately λ/4 between the first and second wide strips of the alignment grating.

An embodiment of the method in accordance with the invention is characterized in that the alignment grating is provided with a pitch ranging from 2 to 20 µm. The use of a pitch of 16.0 µm has the advantage that an alignment grating based on this pitch is compatible with conventional aligning equipment, the operation of which is still based on a pitch of 16.0 µm, possibly in combination with a pitch of 17.6 µm. Since alignment errors are proportional to the pitch of the alignment grating, the pitch of the alignment grating will be reduced in the future, in view of the manufacture of new generations of integrated circuits having smaller line widths, thus enabling a more accurate and more reliable alignment to be achieved.

An embodiment of the method in accordance with the invention is characterized in that the first and second wide strips are provided in an at least substantially equal width. The use of first and second wide strips of equal width causes the intensities of sub-beams deflected in a first diffraction order by the alignment grating to be maximal which sub-beams are still used in conventional aligning equipment.

An embodiment of the method in accordance with the invention is characterized in that the alignment grating is provided on the surface of the silicon body in a local alignment marker, comprising two patterns of adjacent strips which are rotated through 90 degrees relative to each other, the pitch of the patterns being at least substantially equal. A local alignment marker is important for aligning a region on the silicon body's surface bordering on the alignment marker relative to a mask pattern, commonly referred to as local aligning, in the X-direction and the Y-direction.

An embodiment of the method in accordance with the invention is characterized in that the alignment grating is provided on the surface of the silicon body in a global alignment marker, comprising four patterns of adjacent strips which are each rotated through 90 degrees relative to the preceding pattern of strips, which patterns can be divided into two groups of two adjoining patterns, the pitch of the groups being different. A global alignment marker is important for aligning the entire silicon body relative to a mask, commonly referred to as global aligning, in the X-direction and the Y-direction. The use of a different pitch increases the capture range of the global alignment marker.

An embodiment of the method in accordance with the invention is characterized in that the global alignment marker is provided at least in duplicate on the surface of the silicon body, each global alignment marker taking up a position near an edge of the silicon body. In order to be able to accurately align the entire silicon body relative to a mask, the global alignment marker must be present at least in duplicate on the surface of the silicon body.

These and other aspects of the invention will be apparent from and elucidated with reference to the embodiments described hereinafter.

DESCRIPTION OF THE PREFERRED EMBODIMENTS

Although the invention will hereinafter be explained by means of a single MOS transistor, it will be obvious to those skilled in the art that the method described can also be used to manufacture CMOS or BICMOS integrated circuits which are known per se.

Figure 1:
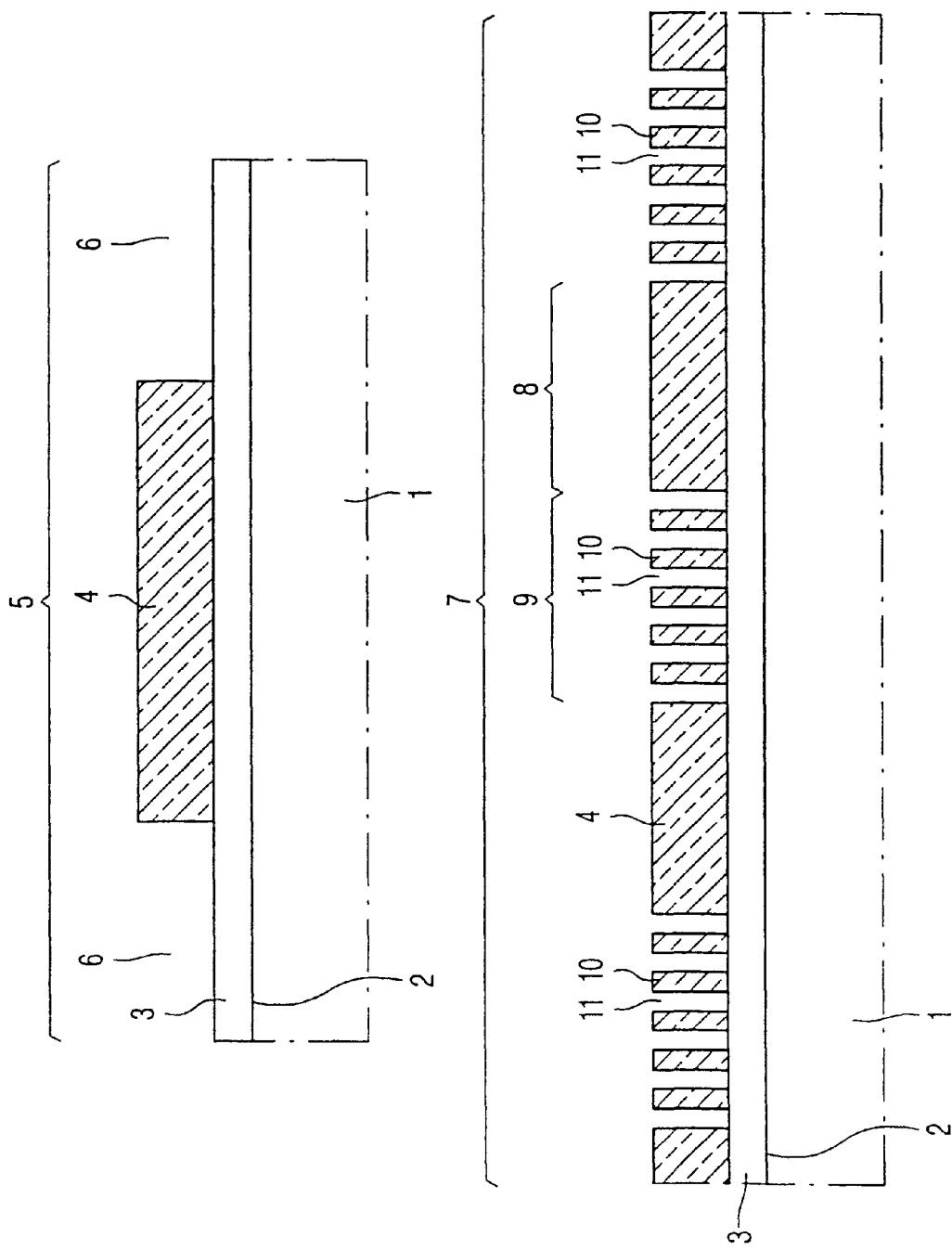
FIGS. 1 through 5 show in diagrammatic cross-section successive stages of the manufacture of a semiconductor device with an at least partly recessed oxide pattern and the concurrent manufacture and further development of an alignment grating in a silicon body by means of the method in accordance with the invention.

FIGS. 1 through 5 show, in diagrammatic cross-section, successive stages in the manufacture of a semiconductor device 5 with an at least partly recessed oxide pattern 12, and the simultaneous manufacture and further development of an alignment grating 7 by means of the method in accordance with the invention. To achieve this, a surface 2 of a silicon body 1 of a first conductivity type, in this example the p-conductivity type, is first provided with a layer 3 of a material protecting the silicon body against oxidation (FIG. 1). Said layer 3 is customarily formed by an oxide layer obtained by oxidation of the silicon body 1, which oxide layer is customarily referred to as padoxide, and on which a layer of silicon nitride is deposited, but said layer 3 may alternatively be formed by a layer of oxynitride or by successive layers of these materials. Subsequently, a mask 4 of a photoresist, if necessary in combination with a bottom-antireflection layer, is provided, which mask has apertures 6 at the location of the semiconductor device 5, which apertures correspond to locations of the partly recessed oxide pattern 12 to be formed. At the location of the alignment grating 7, the mask 4 of photoresist has a pattern of first relatively wide strips 8, where the layer 3 of material protecting against oxidation is fully covered with photoresist, which alternate with second relatively wide strips 9, which each consist of a sub-pattern of relatively narrow strips 10 covered with photoresist, which are separated from each other by relatively narrow apertures 11, which are smaller than the apertures 6 at the location of the semiconductor device 5. Subsequently, of the layer 3 of material protecting against oxidation, the parts present in the apertures 6 and 11 are removed.

Figure 2:
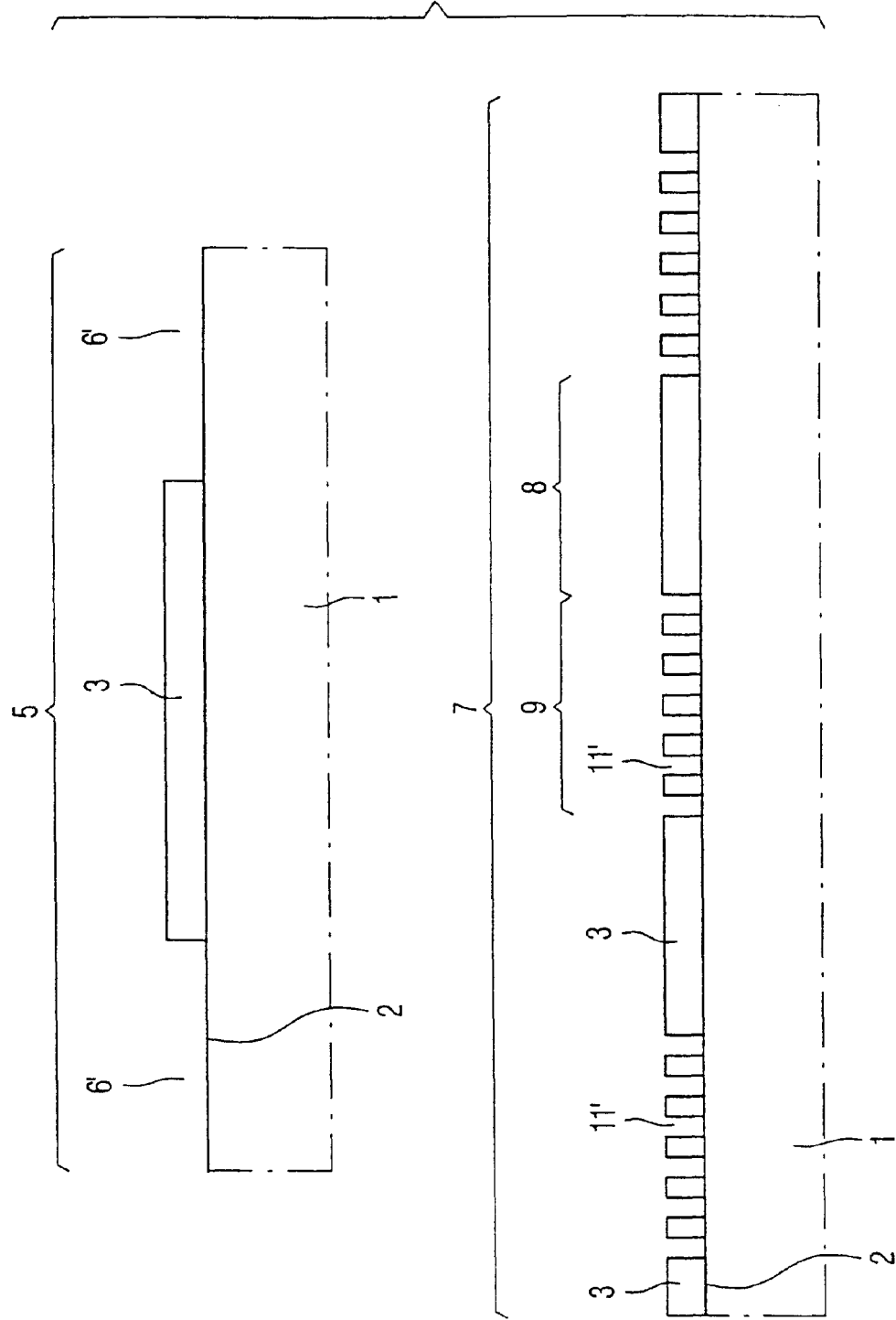
Figure 3:
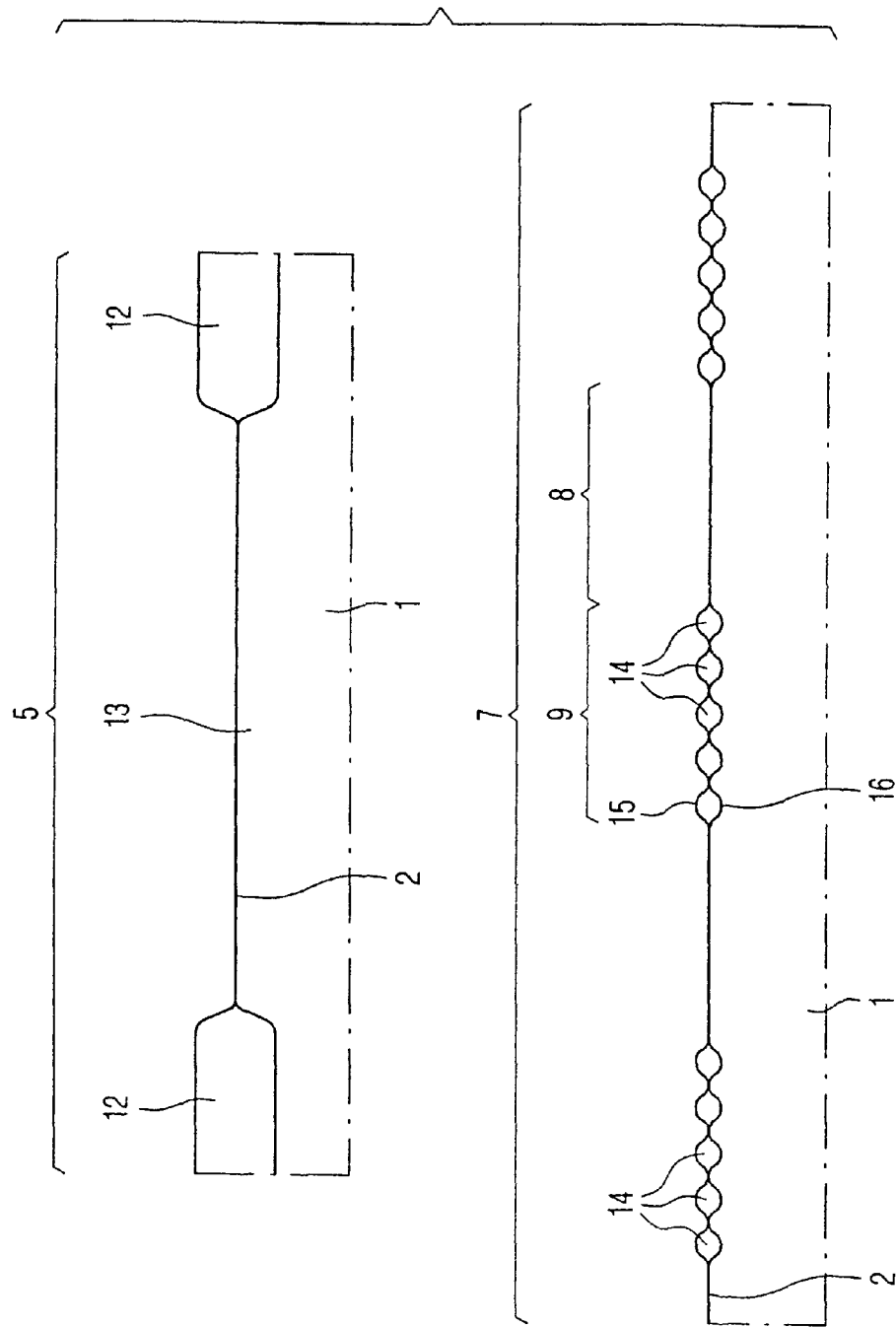

Subsequently, as shown in FIG. 2, also the mask 4 of photoresist is removed and apertures 6' and 11' in the layer 3 of material protecting against oxidation remain. The pattern of the mask 4 of photoresist at the location of the alignment grating 7 has been transferred to the layer 3 of material protecting against oxidation. The silicon body 1 is subsequently subjected to an oxidation treatment, for example a thermal oxidation, in which, at the location of the semiconductor device 5, the partly recessed oxide pattern 12 is formed which defines an active region 13 in the silicon body 1 (FIG. 3). At the same time, each of the second wide strips 9 is provided with a segmented, also partly recessed, oxide pattern 14 at the location of the alignment grating 7, which oxide pattern has a profiled surface 15 and a profiled interface 16 with the silicon body 1. Next, the remaining parts of the layer 3 of material protecting against oxidation are removed. The result obtained at this stage is shown in FIG. 3.

In accordance with the invention, the relatively narrow apertures 11' at the location of the second wide strips 9 of the alignment grating 7 are made so small relative to the apertures 6' at the location of the semiconductor device 5, that during the subsequent thermal oxidation oxide is formed in the relatively narrow apertures 11' in a thickness which is smaller than that of the oxide simultaneously formed in the apertures 6'. This is utilized to create, at the location of the alignment grating 7, a difference in height which is necessary to align the silicon body 1, which difference in height is smaller than the difference in height that would be created if, also at the location of the alignment grating, the oxide could attain the full thickness, that is the thickness at the location of the semiconductor device 5, which in this example ranges from 0.5 to 1.0 $\mu$m.

The alignment grating 7 (FIG. 3) thus formed consists of first relatively wide strips 8, where the surface 2 of the silicon body 1 is free of oxide, which alternate with second relatively wide strips 9, which are each provided with the segmented, partly recessed oxide pattern 14. During subsequent process steps necessary for the further manufacture of the semiconductor device 5, the alignment grating 7 is used to align the silicon body 1 relative to masks (not shown), which are used in these process steps to image patterns onto the surface of the silicon body. A detailed description of an aligning process and the aligning equipment used, customarily referred to as wafer stepper, is given in U.S. Pat. No. 4,251,160.

During aligning the silicon body 1 relative to a mask, the alignment grating 7 provided in the silicon body in the manner described above is exposed by means of a laser beam or another collimated beam and imaged onto a corresponding alignment grating which is provided in the mask. The exposed alignment grating 7 behaves like a phase-diffraction grating with a pitch corresponding to the regular interval between the repetitive, equal patterns which each consist of a first wide strip 8 which borders on a second wide strip 9. The sub-beams deflected by the alignment grating 7 in different diffraction orders above 0 each contain an indication about the position of the alignment grating 7 relative to the corresponding alignment grating in the mask. Via detection of the sub-beams deflected in specific orders, the image of the alignment grating 7 provided in the silicon body 1 is accurately matched with the corresponding alignment grating in the mask, so that the silicon body 1 is properly aligned relative to the mask.

In the present example, the first and second wide strips 8 and 9 of the alignment grating 7 are of equal width in the range from 1 to 10 $\mu$m. The use of equally wide first and second strips has the advantage that intensities of the sub-beams deflected in the first diffraction order by the alignment grating, which sub-beams are still used in conventional alignment equipment, are maximal. The first and second wide strips 8 and 9 may alternatively be of different width, within the above-indicated range, which may be advantageous if sub-beams deflected in diffraction orders above 1 are used. The pitch of the alignment grating 7 generally lies in the range from 2 to 20 $\mu$m. The use of a pitch of 16.0 $\mu$m has the advantage that an alignment grating based on this pitch is compatible with conventional alignment equipment, the operation of which is still based on a pitch of 16.0 $\mu$m, if necessary in combination with a pitch of 17.6 $\mu$m. Since alignment errors are proportional to the pitch of the alignment grating, said pitch of the alignment grating will be reduced in the future in view of the manufacture of new generations of integrated circuits with smaller line widths, so that a more accurate and more reliable alignment can be brought about.

The light used for aligning generally lies in the wavelength range from 500 to 1100 nm. Use can be made, for example, of a He—Ne laser having a wavelength of 633 nm, which is currently the most widely used aligning beam, but use can also be made of a Nd:YAF laser having a wavelength of 1064 nm, a Nd:YLF laser having a wavelength of 1047 nm or a III–V or II–VI diode laser having a wavelength which is determined by the semiconductor material used, for example InGaP having a wavelength range around 500 nm or InGaAs having a wavelength range between approximately 1000 and 1500 nm. The accuracy and reliability with which the silicon body can be aligned relative to a mask increases with the wavelength of the aligning beam.

To minimize alignment errors, in general an average optical path length difference between the deflected beams originating from the first wide strips 8 and the second wide strips 9 is created, which corresponds approximately to $(2n+1)\lambda/2$, where n is an integer equal to or greater than 0 and $\lambda$ is the wavelength of the light used for aligning. This amounts to an average optical difference in height of approximately $(2n+1)\lambda/4$ between the first wide strips 8 and the second wide strips 9 of the alignment grating 7. In particular, approximately $\lambda/4(n=0)$ is used for the average optical difference in height because this results in smaller relatively narrow apertures 11', which is advantageous in view of a possible future shift towards smaller pitches.

In the aligning steps preceding the formation of a first opaque layer, for example of polysilicon, the light is reflected, at the location of the second wide strips 9 which are each provided with the segmented, partly recessed oxide pattern 14, at the profiled interface 16 between the partly recessed oxide pattern 14 and the silicon body 1. At the location of the first wide strips 8, where the surface of the silicon body is free of oxide, reflection of the light takes place at the surface 2 of the silicon body 1. It has been found that an average optical difference in height of approximately $\lambda/4$ between the first and the second wide strips 8 and 9 is achieved if the thickness of the oxide in the relatively narrow apertures 11' ranges from approximately 0.1 to 0.4 $\mu$m at the location of the alignment grating.

Figure 4:
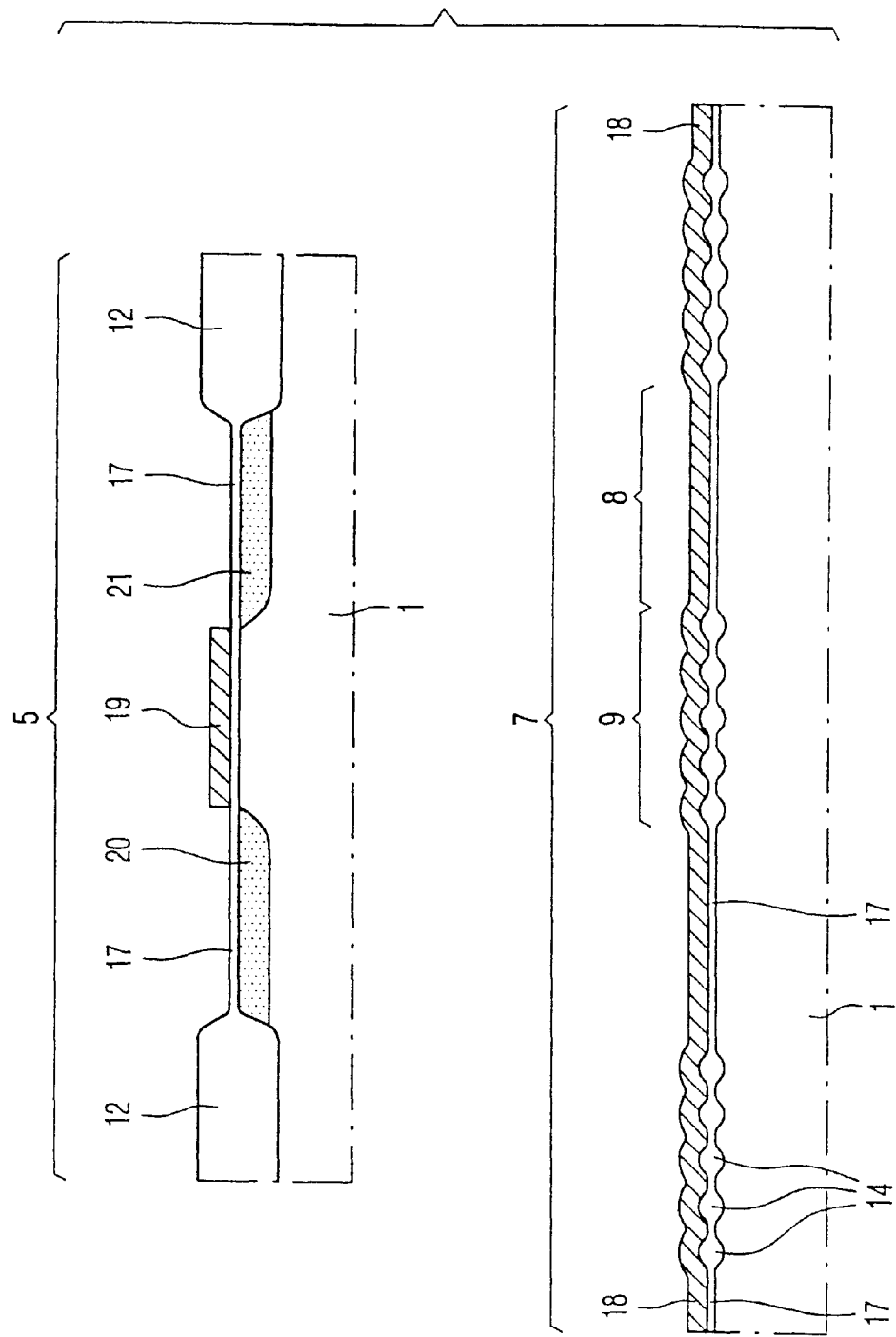

After the thermal oxidation process and the subsequent removal of the remaining parts of the layer 3 of a material protecting against oxidation, a gate oxide 17 is provided at the location of the semiconductor device 5 (FIG. 4). Next, a layer of polysilicon 18 is provided which, in this example, is the first opaque layer. At the location of the semiconductor device 5, the layer of polysilicon 18 is provided with a pattern, if necessary after doping with, for example, phosphor, so that it can be used as a gate electrode 19. Subsequently, at the location of the semiconductor device 5, source and drain-forming silicon regions 20 and 21 of a second conductivity type, in this example the n-conductivity type, are formed via implantation, the partly recessed oxide pattern 12 and the gate electrode 19 jointly serving as a mask. The result obtained at this stage is shown in FIG. 4.

Figure 5:
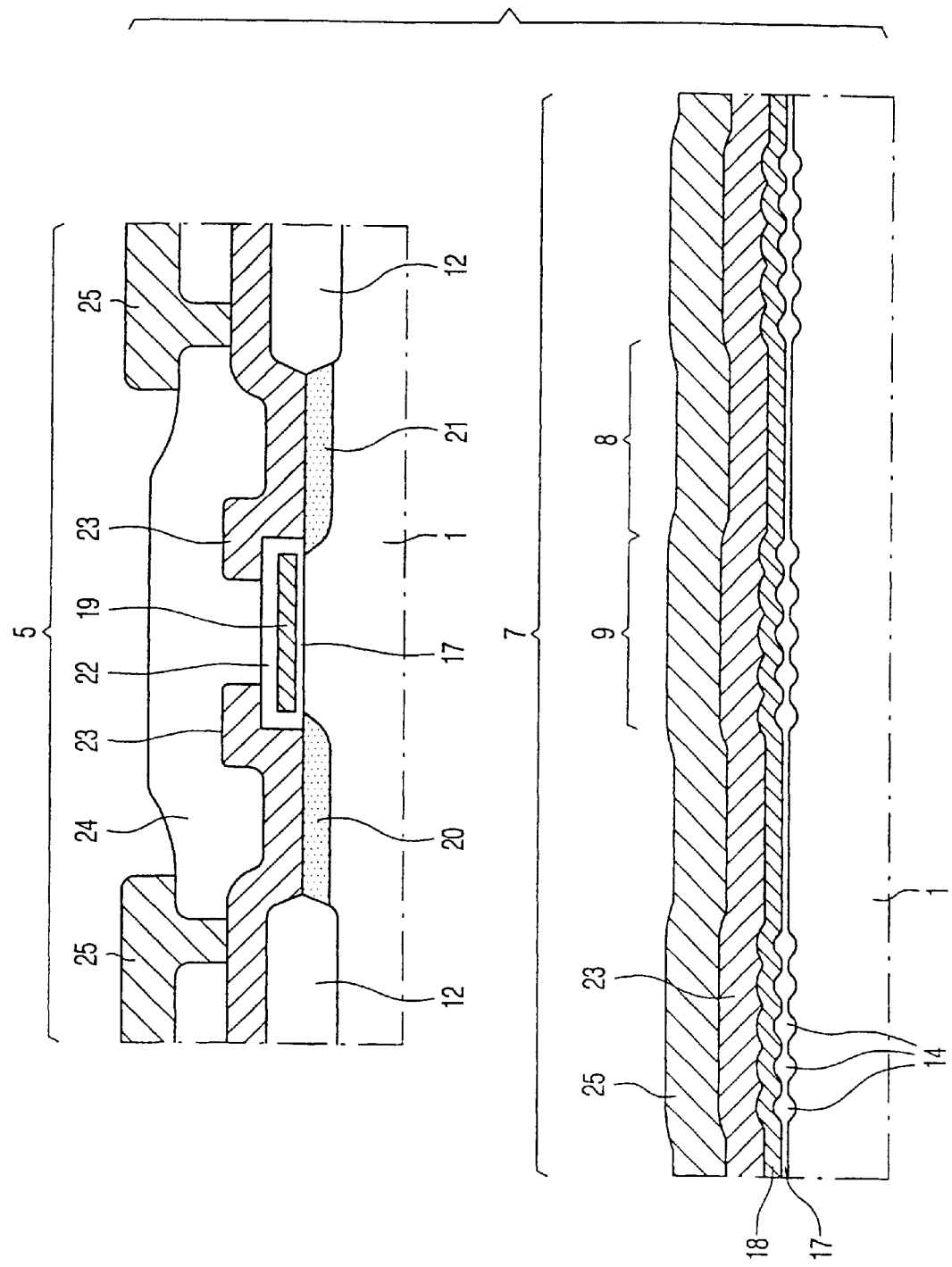

As shown in FIG. 5, a dielectric layer 22, which in the present example is made of silicon oxide, is subsequently formed at the location of the semiconductor device 5 and provided with contact holes for providing contact between, on the one hand, the source and drain-forming silicon regions 20 and 21 and, on the other hand, a first metal layer 23, which in this example is made of aluminium, which metal layer, after it has been provided on the surface, is patterned at the location of the semiconductor device 5. Next, at the location of the semiconductor device 5, a further dielectric layer 24, in this case of silicon oxide, is formed and provided with contact holes for providing contact between the first metal layer 23 and a second metal layer 25, in this case of aluminium, which after it has been provided on the surface is patterned at the location of the semiconductor device 5. The dielectric layers 22 and 24 are removed at the location of the alignment grating 7 during the formation of the above-mentioned contact holes in said layers. Instead of silicon oxide, other suitable electrically insulating materials, such as for example silicon nitride, may be used for the dielectric layers 22 and 24. In addition, the metal layers 23 and 25 may alternatively be made of a material other than aluminium, for example tungsten or another suitable metal or combination of metals.

In the aligning steps following the formation of the first layer that is impervious to the light used, in the present example the polysilicon layer 18, reflection of the light takes place at the location of both the first wide strips 8 and the second wide strips 9 at the surface of the layer provided last, which is an opaque layer, in this example the polysilicon layer 18, the first metal layer 23 or the second metal layer 25. It has been found that also at this stage in the manufacture an average optical difference in height of approximately $\lambda/4$ is achieved between the first wide strips 8 and the second wide strips 9 if the thickness of the oxide in the relatively narrow apertures 11' ranges from approximately 0.1 to 0.4 $\mu$m at the location of the alignment grating 7.

Figure 6:
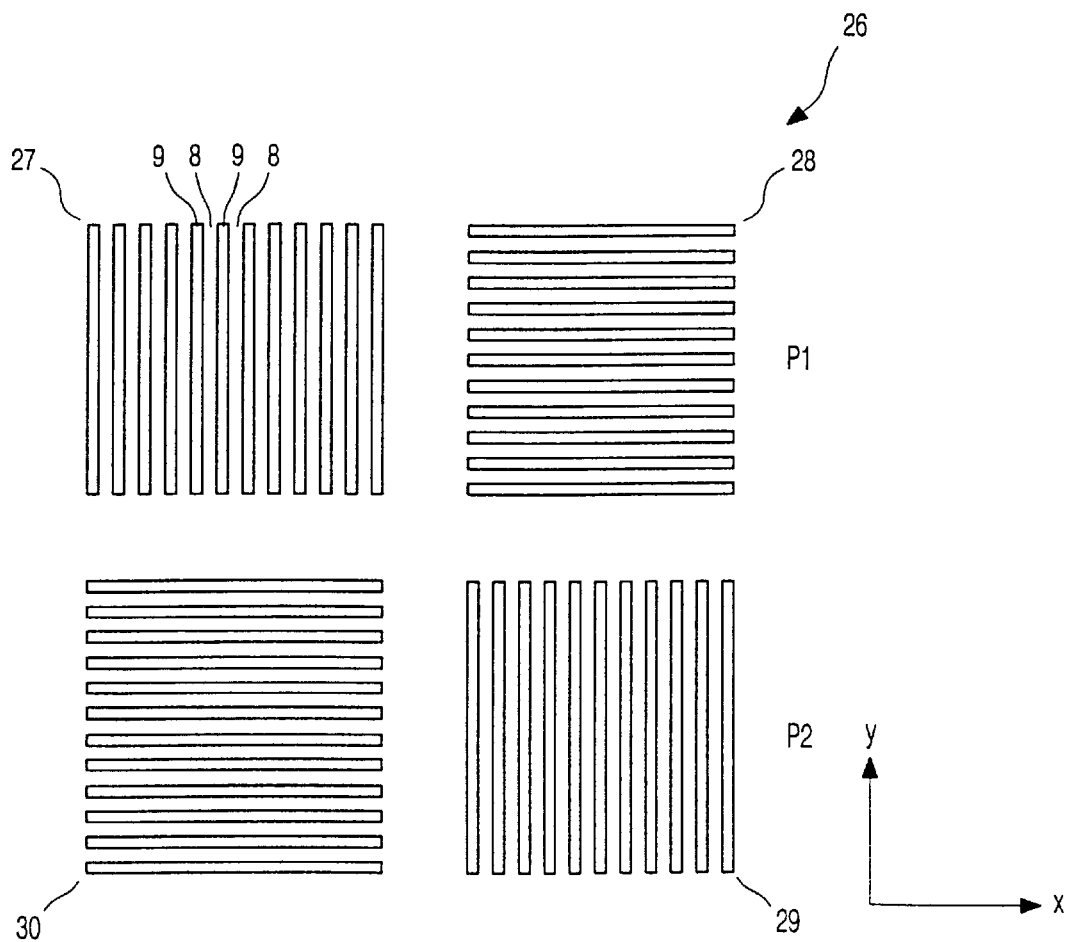
FIG. 6 is a diagrammatic plan view of a global alignment marker manufactured by means of the method in accordance with the invention.

FIG. 6 shows a global alignment marker 26 on an enlarged scale, which comprises four alignment gratings 27, 28, 29 and 30 which are each rotated through 90 degrees relative to the preceding alignment grating, said alignment gratings being made by means of the method in accordance with the invention. As shown in FIG. 3, each of the alignment gratings is provided so as to correspond to a pattern formed by the alternating first relatively wide strips 8, where the surface of the silicon body is free of recessed oxide, and the second relatively wide strips 9, which are each provided with the segmented, partly recessed oxide pattern 14. The global alignment marker 26 is a two-dimensional alignment marker, the alignment gratings 27 and 29 being used to align in the X-direction, and the alignment gratings 28 and 30 to align in the Y-direction. The alignment gratings 27 and 28 have an equal pitch P1 in the range from 2 to 20 $\mu$m, for example 16.0 $\mu$m, while the alignment gratings 29 and 30 have a different pitch P2, which also ranges from 2 to 20 $\mu$m, for example 17.6 $\mu$m. The use of different pitches generally leads to an increase of the capture range of the alignment marker in the X-direction as well as in the Y-direction. Each of the alignment gratings may occupy a surface area of, for example, 200×200 $\mu$m. Consequently, the global alignment marker 26 occupies an overall surface area of approximately 400×400 $\mu$m. As described in U.S. Pat. No. 4,251,160, a two-dimensional alignment marker may have shapes other than the one indicated in this example.

To align the entire silicon body 1 relative to a mask, the so-called global alignment, the surface 2 of the silicon body is generally provided with at least two global alignment markers 26, which are individually provided at an edge of the silicon body outside regions where the mask pattern is imaged. In order to be able to individually align each of said regions with respect to the mask pattern, sometimes not only global alignment markers but also local alignment markers are present on the surface of the silicon body, which local alignment markers are generally smaller than the global alignment markers, for example 80×400 $\mu$m, and are positioned on so-called write lines, which separate the above-mentioned regions from each other. These local alignment markers are also two-dimensional and generally consist of two alignment gratings which are rotated through 90 degrees relative to each other and which have an equal pitch in the range from 2 to 20 $\mu$m, one of the alignment gratings being used to align in the X-direction and the other to align in the Y-direction.

It will be obvious that the invention is not limited to the example described herein, and that within the scope of the invention many variations are possible to those skilled in the art. For example, in addition to the first and the second metal layer indicated herein, further metal layers may be present which are electrically insulated from each other at the location of the semiconductor device by means of further dielectric layers. Moreover, it will be evident that the first wide strips and the second wide strips may be interrupted instead of continuous. It is also possible to use barrier layers and anti-reflection layers, for example TiN or Ti/TiN. Furthermore, the dielectric layers may remain at the location of the alignment grating, whereafter, as a result of the transparency of these layers to light used during aligning, alignment is possible on the surface of the layer provided last, which is an opaque layer, in this case the layer of polysilicon or a metal layer. Of course, it is also possible for the silicon body to be n-conductivity type and for the source and drain-forming silicon regions to be p-conductivity type.

What is claimed is:

1. A method of manufacturing a semiconductor device, in particular an integrated circuit, in a silicon body, comprising providing an alignment grating at a surface for aligning the silicon body relative to masks which are used in a number of successive process steps to image patterns onto the surface of the silicon body; providing the alignment grating in the form of a strip pattern of adjacent elevations and valleys; and providing the surface with a mask of a material which protects the silicon body against oxidation; providing the mask with apertures at the location of the semiconductor device; then providing the silicon body with an oxide pattern by means of oxidation; recessing the pattern in the silicon body over at least a part of its thickness to define active regions in the silicon body; simultaneously providing the alignment grating and the partly recessed oxide pattern; providing the material which protects against oxidation at the location of the alignment grating to be produced so as to comprise first wide strips, where the surface remains entirely free of recessed oxide, which alternate with second wide strips; forming each of said second wide strips by a sub-pattern of relatively narrow strips of the material which protects against oxidation; separating said narrow strips from each other by relatively narrow apertures, which are smaller than the apertures at the location of the semiconductor device; then, during oxidation, providing each of the second wide strips with a segmented, also partly recessed, oxide pattern with a profiled surface; providing the relatively narrow apertures with a width such that the recessed oxide pattern in the alignment grating is thinner than the simultaneously formed recessed oxide pattern in the semiconductor device.

2. A method of manufacturing a semiconductor device as claimed in claim 1, wherein, after moving the material protecting against oxidation providing a first opaque layer on the surface of the silicon body; using the alignment grating, both in process steps preceding the provision of the opaque layer and in subsequent process steps, to align the silicon body relative to the masks used in the relevant process steps.

3. A method of manufacturing a semiconductor device as claimed in claim 1 comprising providing the recessed oxide pattern in the alignment grating in such a manner that at the location of the alignment grating an average optical difference in height is achieved between the first and the second wide strips, which corresponds approximately to $(2n+1)\lambda/4$, where n is an integer $\geq 0$ and $\lambda$ is the wavelength of the light used for aligning.

4. A method of manufacturing a semiconductor device as claimed in claim 3, using approximately $\lambda/4$ as the average optical difference in height.

5. A method of manufacturing a semiconductor device as claimed in claim 4, comprising providing the recessed oxide pattern in the alignment grating so as to have an average thickness in the range from approximately 0.1 to 0.4 $\mu$m.

6. A method of manufacturing a semiconductor device as claimed in claim 5, comprising providing the recessed oxide pattern in the semiconductor device so as to have a thickness ranging from 0.5 to 1.0 m.

7. A method of manufacturing a semiconductor device as claimed in claim 1 comprising providing the alignment grating with a pitch ranging from 2 to 20 $\mu$m.

8. A method of manufacturing a semiconductor device as claimed in claim 7, comprising providing the first and second wide strips in an at least substantially equal width.

9. A method of manufacturing a semiconductor device as claimed in claim 1 comprising providing the alignment grating on the surface of the silicon body in a local alignment marker, comprising two patterns of adjacent strips which are rotated through 90 degrees relative to each other, the pitch of the patterns being at least substantially equal.

10. A method of manufacturing a semiconductor device as claimed in claim 1 comprising providing the alignment grating on the surface of the silicon body in a global alignment marker, comprising four patterns of adjacent strips which are each rotated through 90 degrees relative to the preceding pattern of strips, which patterns can be divided into two groups of two adjoining patterns, the pitch of the groups being different.

11. A method of manufacturing a semiconductor device as claimed in claim 10, comprising providing the global alignment marker at least in duplicate on the surface of the silicon body, each global alignment marker taking up a position near an edge of the silicon body.

* * * * *